United States Patent [19]
Adler et al.

[11] Patent Number: 4,656,493
[45] Date of Patent: Apr. 7, 1987

[54] BIDIRECTIONAL, HIGH-SPEED POWER MOSFET DEVICES WITH DEEP LEVEL RECOMBINATION CENTERS IN BASE REGION

[75] Inventors: Michael S. Adler; Peter V. Gray, both of Schenectady, N.Y.

[73] Assignee: General Electric Company, Schenectady, N.Y.

[21] Appl. No.: 698,498

[22] Filed: Feb. 5, 1985

Related U.S. Application Data

[63] Continuation of Ser. No. 376,058, May 10, 1982, abandoned.

[51] Int. Cl.[4] ............................................. H01L 29/78
[52] U.S. Cl. .................................. 357/23.4; 357/23.12; 357/41; 357/64
[58] Field of Search .................... 357/42, 23.4, 64, 41, 357/23.12

[56] References Cited

U.S. PATENT DOCUMENTS

| | | | |
|---|---|---|---|
| 3,585,463 | 6/1971 | Richman | 357/23.4 |
| 3,891,468 | 6/1975 | Ito et al. | 357/23.4 |
| 4,199,774 | 4/1980 | Plummer | 357/39 |
| 4,210,922 | 7/1980 | Shannon | 357/64 |
| 4,318,750 | 3/1982 | Rai-Choudhury et al. | 357/64 |
| 4,414,560 | 11/1983 | Lidow | 357/23.4 |

FOREIGN PATENT DOCUMENTS 1345818 2/1974 United Kingdom .

OTHER PUBLICATIONS

J. Tihanyi, "Funct. Integ . . . Dev.," 1980 IEDM, CH 1616-2, pp. 75-78.
J. Plummer et al, "Insulated–Gate . . . Opr.," IEEE Trans. on Elec. Dev., vol. ED-27, #2, Feb. 1980, pp. 380-394.
R. Severns, "The Power MOSFET . . . ," Power Conversion Int'l., Mar.-Apr. 1980, pp. 49-50.
Wang, C. S., "Laterally Symmetrical, Nonuniformly Doped MOS Devices", IBM Technical Disclosure Bulletin, vol. 22, No. 1, Jun., 1979, pp. 398-400.

*Primary Examiner*—Joseph E. Clawson, Jr.
*Attorney, Agent, or Firm*—Marvin Snyder; James C. Davis, Jr.

[57] ABSTRACT

Power MOSFET devices useful in synchronous rectifier circuit applications are bidirectional and symmetrical for use in AC circuits, and have low on-resistance, fast switching speed, and high voltage capability. In one embodiment, a planar enhancement-mode diffused MOSFET structure obviates the source-to-base short conventionally included to prevent turn-on of the parasitic bipolar transistor defined by the main terminal regions of one conductivity type and the intermediate base region of opposite conductivity type, by employing within the base region a recombination region having a relatively small lifetime for excess base region majority-carriers in order to inhibit operation of the parasitic bipolar transistor. Another embodiment resembles a pair of conventional, vertical-current, MOSFET unit cells formed symmetrically back-to-back and sharing a common drain region which serves only as an intermediate terminal region not directly connected to any device terminal. To inhibit operation of the several parasitic bipolar transistors and thyristor switching device structures inherent in this embodiment, an ohmic short is provided between the source and base regions of each of the unit cells, and a recombination region having a relatively small lifetime for intermediate terminal region majority-carriers is formed within the intermediate terminal region between the spaced base regions of the unit cells.

6 Claims, 5 Drawing Figures

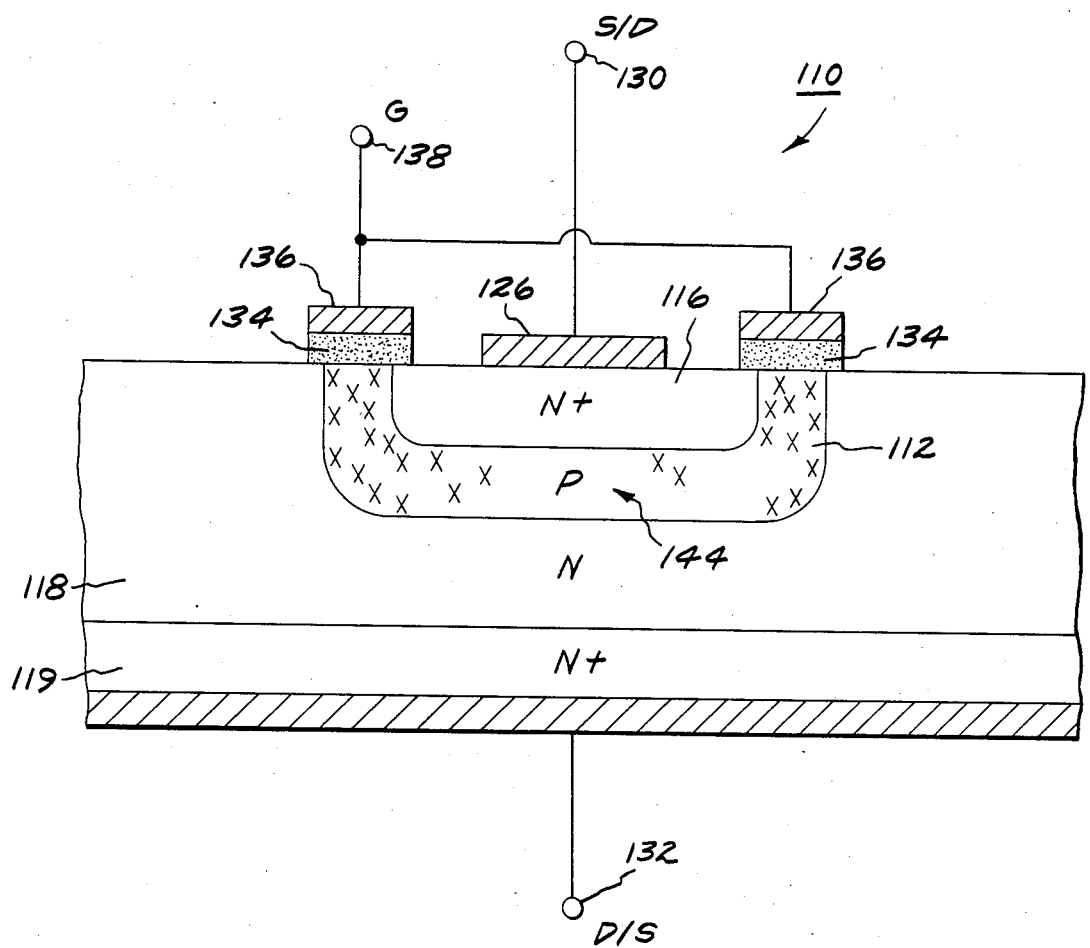

BIDIRECTIONAL, HIGH-SPEED POWER MOSFET DEVICES WITH DEEP LEVEL RECOMBINATION CENTERS IN BASE REGION

This application is a continuation of application Ser. No. 376,058 filed May 10, 1982 now abandoned.

BACKGROUND OF THE INVENTION

The present invention relates generally to power metal-oxide-semiconductor field-effect transistors (MOSFETs) and, more particularly, to such devices useful in synchronous rectifier circuit applications and exhibiting low on-resistance, fast switching speed, high voltage capability, and bidirectionality for use in AC circuits.

Power MOSFET devices have a number of advantageous characteristics including high gate impedance, low on-resistance for low forward voltage drop, high withstand voltage capability, and fast switching speeds. Properly gated, they can be employed in synchronous rectifier circuits which previously have employed devices such as conventional PN junction rectifiers, Schottky rectifiers, or bipolar transistor synchronous rectifiers. Power MOSFETs have certain advantages over all of these devices. For example, a PN junction rectifier has a relatively high forward voltage drop (greater than 0.75 volts) and a relatively slow switching speed because upon polarity reversal stored charges must be cleared out before the device will cease conducting. Schottky junction rectifiers substantially eliminate the switching speed problem, but only somewhat alleviate the forward voltage drop problem, which is still greater than approximately 0.5 volts for silicon Schottky-junction devices at high current. Schottky-junction devices generally are lacking in reverse blocking capability in that they have relatively high leakage when reverse biased.

Known power MOSFET structures generally comprise a number of individual unit cells, formed on a single semiconductor wafer, with each device being typically of the order of 300 mils (0.3 inches) square in size and all cells in each device being electrically connected in parallel. Various geometries for the individual unit cells are employed, with an interdigitated comb-like structure being typical. A typical power MOSFET is a double-diffused structure and includes a common drain region of, for example, N conductivity type semiconductor material. Formed within the drain region, preferably by diffusion, is a base region of P conductivity type, and then a source region is formed entirely within the base region. The source region is of N conductivity type, the same as the drain region. At the device surface, the base region exists as a band of P conductivity type semiconductor material between the N conductivity type source and drain regions. A MOSFET gate insulating layer and a conductive gate electrode are disposed over this band. In operation, when gate voltage of the proper polarity (positive for an N-channel MOSFET) is applied to the gate electrode, an electric field is created which extends through the gate insulating layer into the base region to induce a thin N-type conductive layer or channel just under the surface of the base region, providing a continuous, low-resistance N conductivity type conduction channel between the source and drain regions. The actual source and drain terminals comprise metallization on the upper and lower device principal surfaces, a common drain terminal serving all the unit cells. Such device may therefore be considered a vertical current device, although the current flows horizontally in the portion of the conduction channel under control of the gate electrode.

In such power MOSFET structure, the source, base and drain regions correspond respectively to the emitter, base and collector of a parasitic bipolar transistor. As is known, if this parasitic bipolar transistor becomes conductive during operation of the power MOSFET, the blocking voltage and the turn-off speed of the power MOSFET will be substantially degraded. To prevent the parasitic bipolar transistor from conducting during operation of the power MOSFET, it is conventional to electrically interconnect, or "short", the layers comprising the source and base regions by means of an ohmic connection, thus preserving the blocking voltage and turn-off speed of the MOSFET. However, such shorts limit the utility of the resultant devices in some circuits since the device structure inherently includes a parasitic PN junction diode connected directly across the main MOSFET terminals, i.e., the source and drain terminals. For example, in the case of an N-channel enhancement-mode MOSFET structure as summarized above, the P conductivity type base region forms a PN junction with the device drain region. By virtue of the source-to-base short, the P conductivity type bas region is in effect electrically connected to the device source terminal. The N conductivity type drain region is of course connected to the device drain terminal. Consequently, a parasitic PN junction diode exists with its anode connected to the MOSFET source terminal and its cathode connected to the MOSFET drain terminal.

In normal operation of an N channel MOSFET in an electrical circuit, the drain terminal is biased positive with respect to the source terminal. In absence of gate voltage (assuming an enhancement mode MOSFET), the MOSFET device is in a blocking state, and essentially no current flows between the source and drain terminals. When positive gate voltage is applied to turn on the device, an N conductivity type channel is induced and establishes a continuous N conductivity type conductive path through the device between the source and drain terminals. Under these circumstances, the parasitic diode comprising the base and drain regions is of no consequence because it is always reverse biased. The diode cathode (MOSFET drain) is always positive with respect to the diode anode (MOSFET base and source). However, should the polarity of the voltage across the source and drain terminals be reversed, thereby forward biasing the diode comprising the base and drain regions, conduction will occur through the device even in absence of gate voltage (assuming the applied voltage is greater than the approximately 0.6 volts at the "knee" of the diode forward conduction curve, as will be understood by those skilled in the art). In effect, then, the MOSFET device appears as a short circuit for reverse supply voltages. This known characteristic of conventional MOSFET devices limits their ease of application in certain circuits, particularly AC circuits. A MOSFET device which can operate with either supply voltage polarity would potentially be of greater use in actual circuit applications.

SUMMARY OF THE INVENTION

Accordingly, it is an object of the invention to provide a power MOSFET in which operation of internal parasitic devices, including bipolar transistors, during high speed MOSFET switching is inhibited, and which is bidirectional, i.e., operable with supply voltages of either polarity between its main source and drain terminals.

It is another object of the invention to provide a power MOSFET device in which the gate terminal maintains full control over device conduction regardless of polarity.

It is yet another object of the invention to provide a bidirectional power MOSFET device which is entirely symmetrical such that withstand voltage, on-resistance, and switching speed are the same for either polarity of operation.

Briefly, and in accordance with one aspect of the invention the source-to-base short heretofore necessary in conventional MOSFETS is eliminated, thus eliminating the parasitic PN junction diode effectively connected between the MOSFET source and drain terminals in conventional power MOSFETS. In order to inhibit operation of the parasitic bipolar transistor in the absence of the short heretofore employed, a recombination region having a relatively small lifetime for excess majority-carriers is included within the MOSFET device. In one embodiment the recombination region is formed within the base region. As will be appreciated by those skilled in the art, normal operation of a bipolar transistor requires that the base region have a large lifetime for base region excess carriers. For example, during normal operation of an NPN bipolar transistor, electrons are injected across the emitter space charge layer into the base, and most of these electrons then flow across the base to be swept into the collector without recombining with base region majority-carriers (holes). A small amount of recombination does occur, however, and a continuous supply of base region majority-carriers (holes) is required to sustain conduction through the device. If, as in the present invention, the population of these base region majority carriers is restricted, such as by having a short lifetime, then operation of the NPN bipolar transistor is inhibited. In essence, then, the present invention allows a parasitic bipolar transistor to exist, but makes it a device which is very poorly conducting.

In the particularly critical moments of MOSFET turn-off, majority-carriers (holes) tend to be created in the base region, both by avalanching and by the rapid increase in voltage between the source and drain terminals. With a sufficiently small lifetime, for example, on the order of one-fifth the intended turn-of time of the MOSFET device, these base region majority-carriers (holes) are "killed" (i.e., recombined with electrons) substantial as fast as they are formed.

The lifetime in the recombination region may be made small by any suitable means known to those skilled in the art. One general approach is by doping with deep level impurities, such as gold or platinum. Another general approach is by using radiation damage to produce defects in the silicon crystal lattice structure. In either event, only the majority-carrier lifetime is altered. The conductivity type and concentration may remain substantially unchanged.

Briefly stated, and in accordance with another aspect of the invention, a bidirectional power MOSFET comprises a semiconductor body including a pair of main terminal regions or one conductivity type, for example N type, and a semiconductor base region of opposite conductivity type separating the main terminal regions and configured so as to present a MOSFET channel surface at which the base region exists as a band of opposite conductivity type between the main terminal regions. Preferably, the device is an entirely symmetrical planar device formed by diffusion techniques. In particular, the base region has a principal surface, and the spaced main terminal regions are formed within, and with lesser lateral extent and depth than, the base region. The main terminal regions have peripheries terminating at the principal surface. A MOSFET gate insulating layer is disposed on the MOSFET channel surface over the base region band, and a conductive gate electrode is disposed on the gate insulating layer and arranged to establish a conductive channel extending between the main terminal regions when gate voltage is applied. A recombination region included within the base region between the main terminal regions assures a relatively small lifetime for base region majority-carriers to avoid excess majority-carrier concentration. Operation of the main terminal region and of the base region as a parasitic bipolar transistor is thus inhibited and, upon turn-off of the power MOSFET, excess base region majority-carriers quickly recombine to produce rapid device turn-off. In the preferred planar structure, the recombination region extends to at least the approximate depth of the main terminal regions.

Briefly, and in accordance with another embodiment of the invention, a symmetrical bidirectional power MOSFET device comprises a semiconductor substrate including an intermediate terminal region of one conductivity type. The intermediate terminal region corresponds generally to the drain region of a conventional vertical-current double-diffused power MOSFET, and has a principal surface. A pair of spaced base regions, each of opposite conductivity type, are formed within, and of lesser lateral extent and depth than, the intermediate terminal region, and these base regions have peripheries terminating at the principal surface. A pair of main terminal regions, each of the one conductivity type, are formed respectively within the base regions. Each of the main terminal regions has a periphery terminating at the principal surface within, and spaced from, the periphery of the corresponding base region such that at the principal surface the base regions respectively exist as bands of opposite conductivity type between the corresponding main terminal region and the intermediate terminal region. An ohmic short is formed between each main terminal region and the corresponding base region such that operation of each of the main terminal regions, the corresponding base region and the intermediate terminal region as a respective parasitic bipolar transistor is inhibited.

A recombination region included within the intermediate terminal region between the spaced base regions extends to a depth of at least approximately the depth of the base regions. The recombination region, by assuring a relatively small lifetime for intermediate terminal region majority-carriers, prevents excess majority-carrier concentration. Operation of the spaced base regions and the intermediate terminal region as a parasitic bipolar transistor is consequently inhibited, facilitating quick recombination of excess intermediate terminal region majority-carriers to permit rapid device turn-off upon turn-off of the power MOSFET.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings, in which:

FIG. 5 is a sectional side view depicting a bidirectional, but unsymmetrical, power MOSFET device in accordance with the invention.

DESCRIPTION OF THE PREFERRED EMBODIMENTS

For convenience, the power MOSFET devices of the invention are described herein as N-channel MOSFETS having N conductivity type silicon semiconductor source and drain regions, and P conductivity type silicon semiconductor base regions. It will be appreciated, however, that all the active regions may be of conductivity type opposite to that which is specifically disclosed. Further, while the specific devices described herein are preferably formed by planar diffusion techniques, other device structures are also encompassed by the broader aspects of the invention, for example V-MOS device structures.

Figure 1:
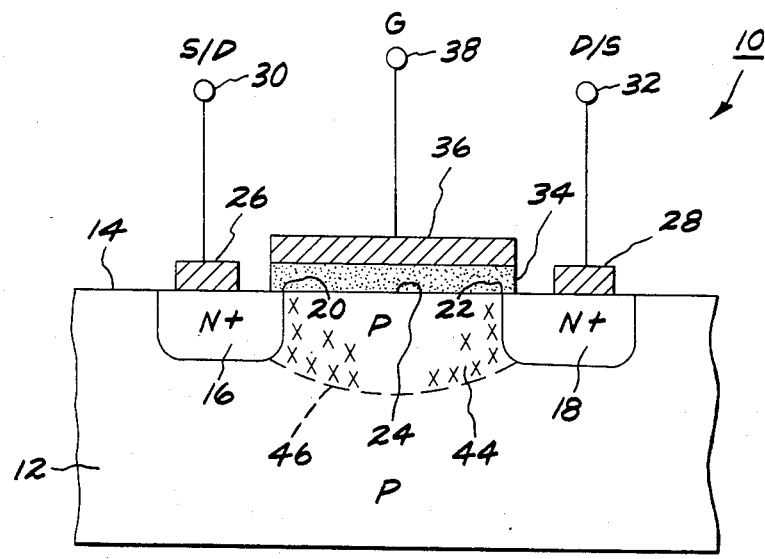
FIG. 1 is a sectional side view depicting a symmetrical bidirectional power MOSFET device in accordance with one embodiment of the invention.

In FIG. 1, a symmetrical bidirectional power MOSFET device, generally designated 10, is shown formed on a semiconductor substrate including a base region 12 of P conductivity type and having a principal surface 14. Formed within base region 12, and of lesser lateral extent and depth than the base region, are a pair of spaced main terminal regions 16 and 18 of N+ conductivity. Main terminal regions 16 and 18 have respective peripheries 20 and 22 terminating at principal surface 14 such that at principal surface 14 a portion of base region 12 exists as a band 24 of P conductivity type between main terminal regions 16 and 18 (both of N+ conductivity). A pair of metallized terminal electrodes 26 and 28 are in ohmic contact with respective main terminal regions 16 and 18, and connected to respective device main terminals 30 and 32.

To complete the basic MOSFET structure, a gate insulating layer 34, such as silicon dioxide, is disposed on principal surface 14 over band 24, and a conductive gate electrode 36, such as evaporated aluminum or highly-doped, and thus highly-conductive, polysilicon, is disposed on gate insulating layer 34 at least laterally over base region band 24. Gate electrode 36 is in turn connected to a device gate terminal 38.

There is thus generally defined an N-channel enhancement mode MOSFET. In operation of the basic MOSFET as thus far described, when a positive gate voltage is applied to gate electrode 36, an electric field is created which extends through gate insulating layer 34 into base region 12, and induces a thin inversion layer, or N-type conductive channel, just under surface 14 below gate insulating layer 34 and gate electrode 36. This induced channel then comprises a conductive path between N+ conductivity type main terminal regions 16 and 18. In absence of positive gate voltage, there is no inversion layer and the portion of base region 12 between symmetrical main terminal regions 16 and 18 comprises a blocking region.

From FIG. 1 it can be seen that device 10 is entirely symmetrical with respect to main terminal regions 16 and 18 and therefore with respect to device terminals 30 and 32. Since device 10 does not include any ohmic shorts between either main terminal region 16 or 18 and base region 12, it is suitable for bidirectional operation, i.e., operating voltage of either polarity may be applied across device main terminals 30 and 32. To be consistent with conventional MOSFET terminology, terminal 30 is designated a source/drain (S/D) terminal, and terminal 32 is designated a drain/source (D/S) terminal. Thus, and as may also be seen by reference to the equivalent circuit of FIG. 2, when terminal 32 is positive with respect to terminal 30, terminal 30 may be considered a MOSFET source terminal and terminal 32 may be considered a MOSFET drain terminal. Conversely, when terminal 30 is positive with respect to terminal 32, terminal 30 may be viewed as the drain terminal, and terminal 32 may be viewed as the source terminal. There is no direct electrical connection to base region 12.

Figure 2:
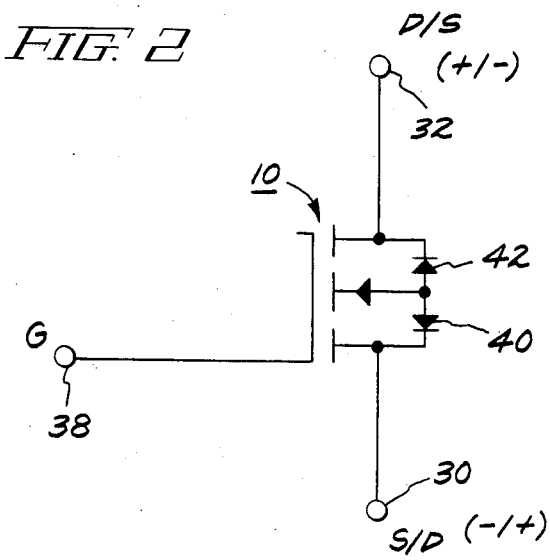
FIG. 2 is an equivalent electrical schematic circuit diagram of the device of FIG. 1.

A pair of parasitic PN junction diodes exist in the device structure of FIG. 1, and in FIG. 2 these diodes are respectively designated 40 and 42. Diode 40 is formed by N+ conductivity main terminal region 16, which comprises the diode cathode region, and P conductivity type base region 12, which comprises the diode anode region. Similarly, diode 42 is formed by N+ conductivity type main terminal region 18, which comprises the diode cathode region, and base region 12, which comprises the diode anode region. Base region 12 thus comprises the anode of both parasitic diodes 40 and 42.

During device operation, parasitic diodes 40 and 42 present no short circuit between the source and drain terminals of device 10 because, being electrically connected back to back, the diodes do not conduct simultaneously.

To prevent main terminal region 16, base region 12 and main terminal region 18 of device 10, shown in FIG. 1, from operating as either the emitter, base and collector regions, respectively, or the collector, base and emitter regions, respectively, of a parasitic NPN bipolar transistor, a recombination region 44 is included in base region 12 between main terminal regions 16 and 18 and extends from surface 14 to a depth of at least approximately the depth of main terminal regions 16 and 18 as indicated by the dashed line 46. (If the main terminal regions are of unequal depths, at each main terminal region the recombination region extends to a depth at least approximately that of the adjacent terminal region). Recombination centers within recombination region 44 are depicted by "X's". These recombination centers may comprise deep level impurity atoms such as gold or platinum, or defects in the silicon semiconductor crystal lattice structure produced by radiation damage. Recombination region 44 thus provides relatively small (short) lifetime for base region majority-carriers (holes for the case of P conductivity type base region 12) and hence serves to avoid excess majority-carrier concentrations. As a result, operation of main terminal regions 16 and 18 and base region 12 as a parasitic bipolar transistor is inhibited. Further, upon turn-off of power MOSFET device 10, excess base region majority-carriers formed by avalanching and resulting from the rapid increase in voltage across main terminal regions 16 and 18 are quickly recombined or killed to provide rapid turn-off of device 10.

To achieve rapid device turn-off time, it is necessary that majority-carrier lifetime within recombination region 44 be on the order of one-fifth of the switching turn-off time desired. For example, for MOSFET device 10 to switch off in fifty nanoseconds, the lifetime in recombination region 44 should be reduced to under ten nanoseconds. For an even faster device, it is contemplated that the lifetime in recombination region 44 be reduced to one nanosecond. This lifetime can be controlled to the desired level by either doping with heavy metals such as gold or platinum or by the use of radiation such as electrons or gamma rays.

In operation, conduction through device 10 of FIGS. 1 and 2 between main terminal regions 16 and 18 is controlled by voltage of either polarity applied to gate terminal 38. Current through device 10 can be turned on and off at any time during an AC cycle regardless of polarity across the device. For the device to be out of conduction, voltage applied to gate terminal 38 must not be positive with respect to either of main terminals 30 and 32. For device 10 to conduct, positive gate voltage with respect to the more negative of the two main terminals 30 and 32 is applied.

While device 10 of FIGS. 1 and 2 comprises a symmetrical bidirectional power MOSFET, a potential disadvantage arises from the fact that the blocking region in base region 12 extends completely between main terminal regions 16 and 18, and this distance also corresponds to length of the induced N-type conduction channel when the device is conductive. As a result, spacing between main terminal regions 16 and 18 must be sufficiently great to provide desired device voltage withstand capability, and meeting this requirement can result in an unduly large MOSFET channel region below gate electrode 36.

Figure 3:
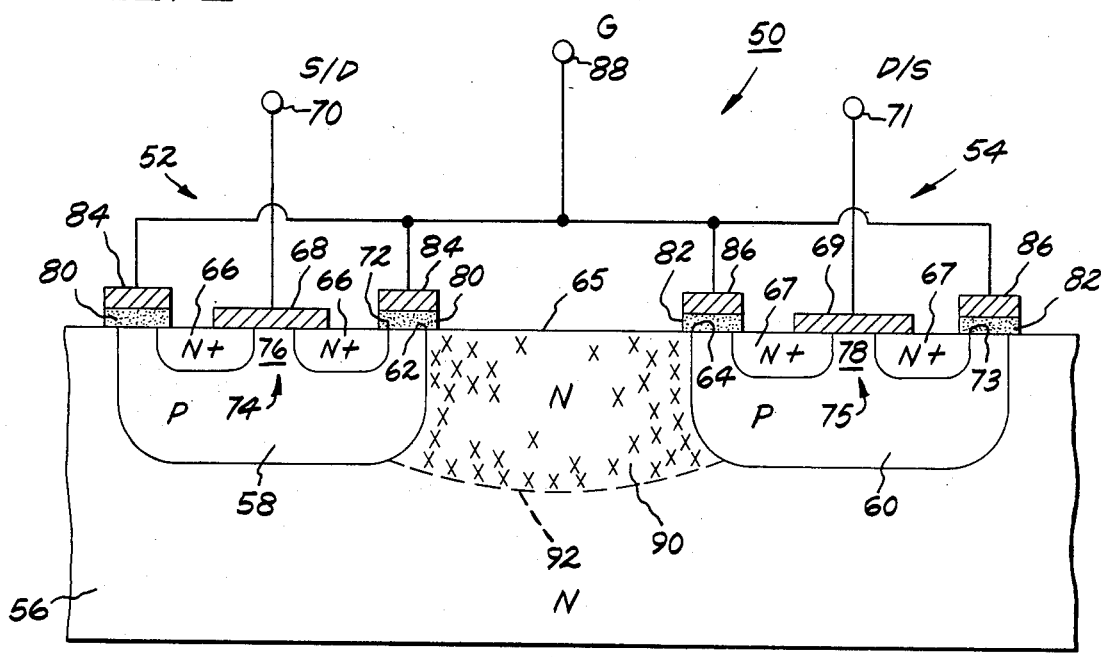
FIG. 3 is a sectional side view of a symmetrical bidirectional power MOSFET device in accordance with another embodiment of the invention.
Figure 4:
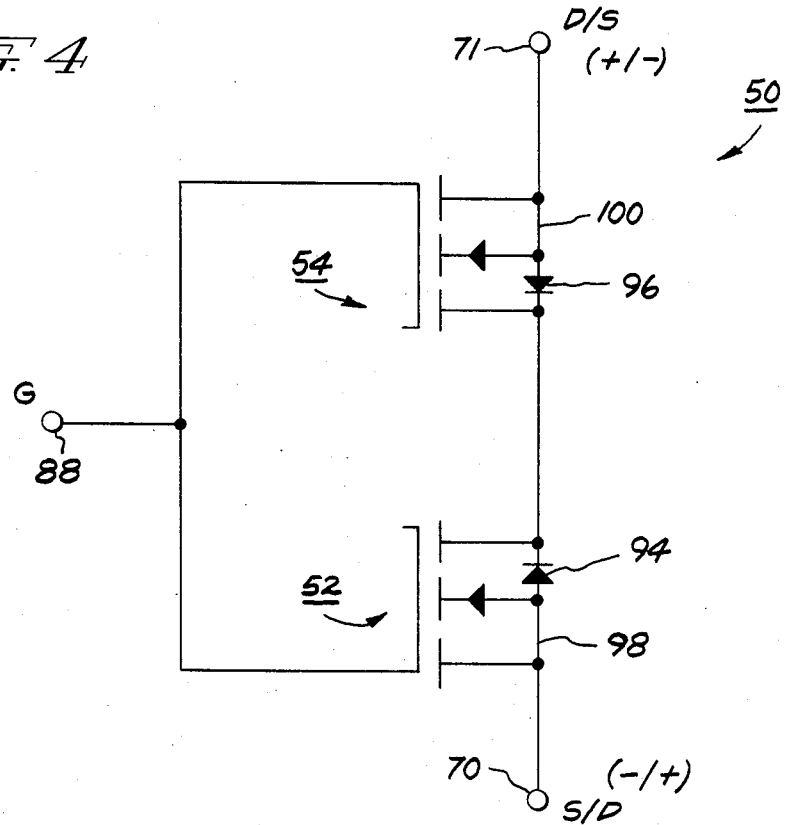
FIG. 4 is an equivalent electrical schematic diagram of the device of FIG. 3.

Referring next to FIGS. 3 and 4, there is depicted another form of symmetrical bidirectional power MOSFET device, generally designated 50, which overcomes the aforementioned disadvantages of the device of FIGS. 1 and 2. Device 50 may be viewed generally as a pair of conventional, vertical-current, MOSFET unit cells 52 and 54 formed symmetrically back-to-back and sharing a common drain region 56 which serves only as an intermediate terminal region not directly connected to any device terminal. Each of MOSFET unit cells 52 and 54 is of the type having an ohmic short between its source and base regions, in accordance with known practice for power MOSFETs as summarized hereinabove.

More particularly, corresponding to the two cells 52 and 54 are a pair of spaced base regions 58 and 60 of P conductivity type formed within, and of lesser lateral extent and depth than, N conductivity type intermediate terminal region 56. Base regions 58 and 60 have respective peripheries 62 and 64 terminating at intermediate terminal region principal surface 65.

Formed respectively in base regions 58 and 60 are a pair of main terminal regions 66 and 67, each of which corresponds generally to the source region of a conventional double-diffused vertical-current power MOSFET. A significant difference, however, is that main terminal regions 66 and 67 have respective individual metallized electrodes 68 and 69 connected to respective device main terminals 70 and 71. (This is unlike a conventional power MOSFET where electrodes 68 and 69 would be electrically connected together to constitute a single source terminal.) Each of main terminal regions 66 and 67 is of N+ conductivity type and has a periphery 72 and 73, respectively, terminating at principal surface 65 within and spaced from periphery 62 and 64, respectively, of the corresponding base region 58 and 60, respectively, such that, at principal surface 65, base regions 58 and 60 exist as bands of opposite conductivity type between the corresponding main terminal regions 66 and 67, respectively, and intermediate terminal region 56. In this structure it can be seen that main terminal regions 66 and 67, base regions 58 and 60, and intermediate terminal region 56 correspond, respectively, to the emitters, bases and collector of a pair of parasitic NPN bipolar transistors; further, these layers also define the structure of a parasitic five-layer NPNPN switching device or thyristor extant between electrodes 68 and 69. Since a parasitic thyristor tends to latch in its conductive state, its effects on operation of the MOSFET device of FIG. 3 can be even more deleterious than those of the parasitic bipolar transistor.

To inhibit operation of the aforementioned parasitic bipolar transistors or parasitic thyristor in the device of FIG. 3, a pair of ohmic shorts, generally designated 74 and 75, are formed between each of main terminal regions 66 and 67 and the corresponding base region 58 or 60. Ohmic shorts 74 and 75 may be formed in any desired manner. For purposes of illustration, FIG. 3 depicts a form of conventional practice wherein respective extensions 76 and 78 of base regions 58 and 60 extend to principal surface 65 so as to be contacted by main terminal metallization 68 and 69, respectively, and as a result also be in ohmic contact with main terminal regions 66 and 67, respectively. Extension 76 or 78 is conventionally formed by first diffusing an acceptor-type impurity into intermediate terminal region 56 to form P conductivity type base regions 58 and 60, applying small diffusion masking strips (not shown) on surface 65 at the location of extensions 76 and 78, then diffusing a donor impurity to form N+ conductivity type main terminal regions 66 and 67, and thereafter removing the masking strips.

Other forms of ohmic shorts 74 and 75 may be employed without the requirement for forming base region extensions 76 and 78. One example is microalloy spiking extending from main terminal metallized electrodes 68 and 69 through terminal regions 66 and 67, respectively, and partly into base regions 58 and 60, respectively. Alternatively, V-grooves may be formed by preferential etching through main terminal 66 and 67 into base regions 58 and 60, respectively, with metallized main electrodes 68 and 69, respectively, then formed within the V-grooves in ohmic contact with both layers. These latter two methods are described in greater detail in commonly-assigned application, Ser. No. 336,972, filed Jan. 4, 1982 by Robert Paul Love, and entitled "Self-Aligned Power MOSFET with Integral Source-Base Short and Methods of Making".

To complete the structure of MOSFET cells 52 and 54, gate insulating layers 80 and 82, respectively, are disposed on principal surface 65 over the base region bands, and conductive gate electrodes 84 and 86, respectively, are disposed on gate insulating layers 80 and 82, respectively, over the base region band portions. Conductive gate electrodes 84 and 86 are electrically connected to a common device gate terminal 88.

From FIG. 3 it will be seen that base region 58, intermediate terminal region 56, and base region 60 comprise the structure of a parasitic PNP bipolar transistor which, if allowed to operate, will degrade operation of power MOSFET device 50, particularly its turn-off speed capability. Moreover, this parasitic PNP bipolar transistor potentially can combine with either main terminal region 66 or 67 to form a parasitic four-layer NPNP switching device, which could latch in its on or conductive state. To inhibit operation of these parasitic devices, a recombination region 90, generally comparable to recombination region 44 of FIG. 1, is formed within intermediate terminal region 56 between spaced base regions 58 and 60 and extends to a depth of at least approximately the depth of base regions 58 and 60 as represented by the dashed line 92. "X's" denote recombination centers within recombination region 90. Recombination region 90 has a relatively small (short) lifetime for intermediate terminal region majority-carriers (electrons in this case) to avoid excess majority-carrier concentrations such that operation of spaced base regions 58 and 60 and intermediate terminal region 56 as the parasitic PNP bipolar transistor is inhibited, in essentially the same manner as described above. This, in turn, inhibits operation of the aforementioned NPNP switching device.

In the equivalent electrical circuit of FIG. 4, it can be seen that the device structure of FIG. 3 includes a pair of parasitic PN junction diodes 94 and 96. As in the equivalent circuit embodiment of FIG. 2, these junction diodes 94 and 96 are connected back-to-back such that they are never simultaneously conducting, allowing operation of the device with either voltage polarity applied across main terminals 70 and 71. In particular, diode 94 comprises P conductivity type base region 58 and N conductivity type intermediate terminal region 56 which respectively form the diode anode and cathode regions. Similarly, diode 96 comprises P conductivity type base region 60 and N conductivity type intermediate terminal region 56. Intermediate terminal region 56 thus serves as a common cathode region for parasitic PN junction diodes 94 and 96.

Source-to-base shorts 74 and 75 of individual MOSFET cells 52 and 54, respectively, in the device of FIG. 3 are represented by conductor segments 98 and 100, respectively, in FIG. 4. Shorts 74 and 75 function to sweep out any excess hole concentrations within base regions 58 and 60, respectively, to prevent operation of the source, base and intermediate terminal regions as parasitic bipolar transistors. Recombination region 90 causes any excess electrons within this region to be recombined to prevent operation of the two base regions 58 and 60 and intermediate terminal region 56 as a parasitic PNP bipolar transistor.

Thus device 50 of FIG. 3 operates as a symmetrical switching device wherein gate terminal 88 effectively controls conduction through the device with either applied polarity. So long as voltage on the device gate terminal 88 is more negative than the most negative voltage applied to either main terminal of the device, neither MOSFET channel conducts, and back-to-back diodes 94 and 96 prevent any other conduction through device 50. With a sufficiently positive increment of voltage added to the gate potential, device 50 conducts.

Finally, FIG. 5 illustrates an embodiment of the more general concepts of the invention comprising a bidirectional power MOSFET device 110 which, however, is not symmetrical; nevertheless, the asymmetrical device 110 of FIG. 5 is generally comparable to the symmetrical device 10 of FIG. 1. Overall, device 110 of FIG. 5 resembles a vertical-current double-diffused power MOSFET, except that there is no source-to-base short and a recombination region 144 is included within the base region.

More particularly, device 110 comprises a P conductivity type base region 112 between an N+ conductivity type source region 116 diffused therein and a drain region 118 comprising the bulk of the device 110. Drain region 118 is formed, such as by epitaxial growth, on an N+ conductivity type substrate 119, connected to device main terminal 132, which serves as a drain/source terminal. The remaining elements of device 110 correspond generally to elements of device 10 in FIG. 1. Corresponding elements are designated by a series of reference numerals to which 100 has been added in FIG. 5.

The foregoing describes a bidirectional power MOSFET in which operation of internal parisitic devices, including bipolar transistors, is inhibited. Because the device is symmetrical, withstand voltage, on-resistance, and switching speed are the same for either polarity of operation. The gate terminal maintains full control over device conduction regardless of polarity.

While specific embodiments of the invention have been illustrated and described herein, it is realized that numerous modifications and changes will occur to those skilled in the art. It is therefore to be understood that the appended claims are intended to cover all such modifications as fall within the true spirit and scope of the invention.

What is claimed is:

1. A symmetrical bidirectional power MOSFET device comprising:
    a semiconductor substrate including a base region of one conductivity type and having a principal surface;
    a pair of spaced main terminal regions, each of opposite conductivity type, formed to approximately the same depth within said base region and being of lesser lateral extend and depth than said base region, said main terminal regions having peripheries terminating at said principal surface such that, at said principal surface, and under influence of an electric field, a portion of said base region exists as a band of opposite conductivity type extending between said main terminal regions;
    a pair of main terminal electrodes in ohmic contact with said main terminal regions, respectively;
    a gate insulating layer disposed on said principal surface over said band of said base region;
    a conductive gate electrode disposed on said gate insulating layer at least laterally over said band of said base region; and
    a recombination region included within said base region between said main terminal regions and extending to a depth of at least approximately the depth of said main terminal regions, said recombination region including deep level impurities for providing a relatively small lifetime for base region majority-carriers to avoid excess majority-carrier concentrations in said recombination region such that operation of said main terminal regions and said base region as a parasitic bipolar transistor is inhibited and such that, upon turnoff of said power MOSFET, excess base region majority-carriers are quickly recombined.

2. A power MOSFET device in accordance with claim 1, wherein said deep level impurities comprise gold.

3. A power MOSFET device in accordance with claim 1, wherein said deep level impurities comprise platinum.

4. A symmetrical bidirectional power MOSFET device comprising:
- a semiconductor subtrate including an intermediate terminal region of one conductivity type and having a principal surface;
- a pair of spaced base regions, each of opposite conductivity type, formed within and of lesser lateral extent and depth than said intermediate terminal region, said base regions having peripheries terminating at said principal surface;
- a pair of main terminal regions of the one conductivity type, formed respectively within each of said base regions, each of said main terminal regions having a periphery terminating at said principal surface within and spaced from the periphery of the corresponding base region, respectively, such that, at said principal surface, and under influence of an electric field, a portion of each of said base regions exists as a band of the one conductivity type between the corresponding main terminal region, respectively, and the intermediate terminal region;
- a pair of ohmic shorts respectively formed between each of said pair of main terminal regions and the corresponding base region, respectively, such that operation of said corresponding base region, together with its associated pair of main terminal regions, respectively, and said intermediate terminal region as a parasitic bipolar transistor is inhibited;
- a gate insulating layer disposed on said principal surface over each band of said base regions;
- a conductive gate electrode disposed on each of said gate insulating layers at least laterally over each band of said base regions; and
- a recombination region included within said intermediate terminal region between and adjacent said spaced base regions, said recombination region including deep level impurities for providing a relatively small lifetime for intermediate terminal region majority-carriers to avoid excess majority-carrier concentrations in said recombination region such that operation of said spaced base regions and said intermediate terminal region as a parasitic bipolar transistor is inhibited and such that, upon turnoff of said power MOSFET, excess intermediate terminal region majority-carriers are quickly recombined.

5. A power MOSFET device in accordance with claim 4, wherein, at each of said base regions, said recombination region extends from said principal surface to a depth of at least approximately the depth of the adjacent base region.

6. A power MOSFET device in accordance with claim 5, wherein said deep level impurities comprise one of the group consisting of gold and platinum.

* * * * *